(12) United States Patent
Leoncini et al.

(10) Patent No.: US 10,326,365 B2
(45) Date of Patent: Jun. 18, 2019

(54) METHOD AND SYSTEM FOR INCREASING EFFICIENCY AND CONTROLLING SLEW RATE IN DC-DC CONVERTERS

(71) Applicant: Intersil Americas LLC, Milpitas, CA (US)

(72) Inventors: Alexandro Leoncini, Raleigh, NC (US); Edward Kohler, Boston, MA (US); Timmy Lok, Palm Bay, FL (US)

(73) Assignee: Intersil Americas LLC, Milpitas, CA (US)

( * ) Notice: Subject to any disclaimer, the term of this patent is extended or adjusted under 35 U.S.C. 154(b) by 5 days.

(21) Appl. No.: 15/802,197

(22) Filed: Nov. 2, 2017

(65) Prior Publication Data

US 2018/0145591 A1    May 24, 2018

Related U.S. Application Data

(63) Continuation of application No. 15/090,659, filed on Apr. 5, 2016, now Pat. No. 9,812,962.

(60) Provisional application No. 62/234,707, filed on Sep. 30, 2015.

(51) Int. Cl.
| | | |
|---|---|---|
| *H03K 5/12* | (2006.01) | |
| *H02M 3/158* | (2006.01) | |
| *H03K 19/0185* | (2006.01) | |
| *H03K 5/04* | (2006.01) | |
| *H03K 5/24* | (2006.01) | |
| *G11C 5/14* | (2006.01) | |
| *H02M 1/38* | (2007.01) | |
| *H02M 1/44* | (2007.01) | |
| *H03K 17/16* | (2006.01) | |
| *H02M 1/00* | (2006.01) | |

(52) U.S. Cl.
CPC ............ *H02M 3/158* (2013.01); *G11C 5/147* (2013.01); *H02M 1/38* (2013.01); *H02M 1/44* (2013.01); *H03K 5/04* (2013.01); *H03K 5/24* (2013.01); *H03K 17/163* (2013.01); *H03K 19/018507* (2013.01); *H02M 2001/0009* (2013.01)

(58) Field of Classification Search
None
See application file for complete search history.

(56) References Cited

U.S. PATENT DOCUMENTS

| | | | |
|---|---|---|---|
| 4,989,127 A * | 1/1991 | Wegener | H02M 1/38 363/16 |
| 4,994,955 A | 2/1991 | Schoofs et al. | |
| 6,791,306 B2 | 9/2004 | Walters et al. | |
| 7,990,740 B1 | 8/2011 | Notohamiprodjo et al. | |
| 8,598,916 B2 | 12/2013 | Miller et al. | |

(Continued)

OTHER PUBLICATIONS

Intersil Americas Inc., "Synchronous Rectified MOSFET Driver", Datasheet ISL6609, ISL6609A, www.lintersil.com, Apr. 27, 2009, FN9221.2, 12 pages.

(Continued)

*Primary Examiner* — Cassandra F Cox
(74) *Attorney, Agent, or Firm* — Foley & Lardner LLP

(57) ABSTRACT

One embodiment pertains to a method including transitioning a logic state of at least one enable signal. A first power transistor begins to turn off. A parameter level of the input of the first power transistor is directly sensed. A second power transistor is turned off when the parameter level is less than a threshold level.

19 Claims, 7 Drawing Sheets

(56) References Cited

U.S. PATENT DOCUMENTS

2011/0279158 A1    11/2011  Chen et al.
2013/0058135 A1     3/2013  Marino
2013/0181748 A1     7/2013  Zajc

OTHER PUBLICATIONS

Intersil Americas LLC, "100v, 2A Peak, Half-Bridge Driver with Tri-Level PWM Input and Adjustable Dead-Time", Datasheet ISL678420, Nov. 6, 2014, FN8296.3, 18 pages.
Linear Technology, "Half-Bridge N-Channel Power MOSFET Driver with Boost Regulator", LT1336 Datasheet, www.linear.com, Oct. 28, 2010. LT101 Rev. A, 20 pages.
Micrel Incorporated, "85V Half-Bridge MOSFET Drivers with Adaptive Dead Time and Shoot-Through Protection", MIC4605 Datasheet, http://www.micrel.com, Nov. 11, 2013, Revision 1.0, 25 pages.
Power Integrations, "Application with SCALE-2 and SCALE-2 Gate Driver Cores", Application Note, www.power.com/igbt-driver, Apr. 1, 2015, Version 2.1, 32 pages.
Power Integrations, "Scale-2 2SC0108T2Dx-xx Preliminary Description & Application Manual", www.power.gbt-driver, Mar. 24, 2015, Version 2.1, 21 pages.

* cited by examiner

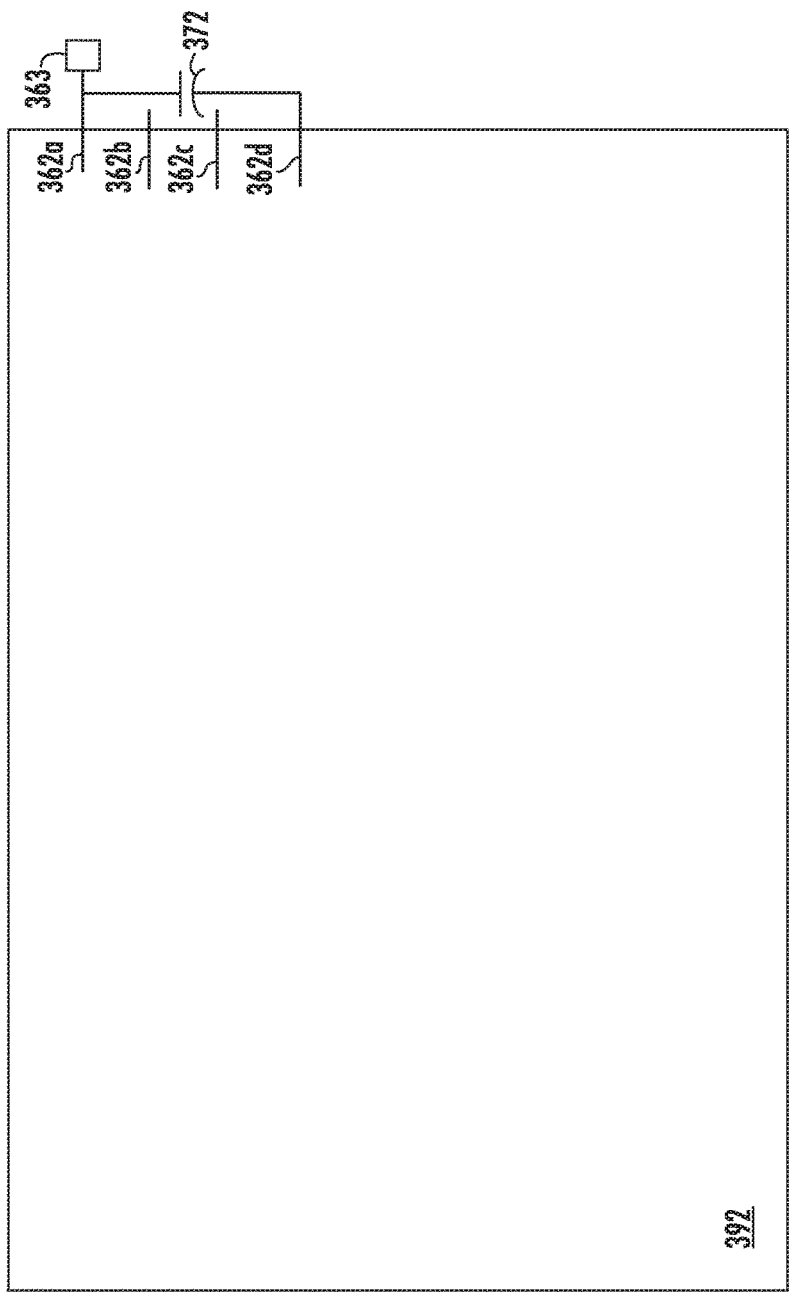

METHOD AND SYSTEM FOR INCREASING EFFICIENCY AND CONTROLLING SLEW RATE IN DC-DC CONVERTERS

CROSS-REFERENCE TO RELATED APPLICATIONS

This application is a continuation of U.S. patent application Ser. No. 15/090,659, filed Apr. 5, 2016, now U.S. Pat. No. 9,812,962, which application claims the benefit of U.S. Provisional Patent Application No. 62/234,707 filed Sep. 30, 2015, the contents of all such applications being incorporated herein by reference in their entirety.

BRIEF DESCRIPTION OF THE DRAWINGS

FIG. 3b illustrates an embodiment of a driver with adaptive dead time and a bootstrap capacitor;

It should be noted that some details of the Figures have been simplified and are drawn to facilitate understanding of the inventive embodiments rather than to maintain strict structural accuracy, detail, and scale. It should also be noted that not all circuit elements and operating steps are illustrated, as the general methods of circuit design and operation are well known. It should also be noted that not all details about voltage converters are illustrated, as general designs of voltage converters are well known.

Reference will now be made in detail to the present embodiments (exemplary embodiments) of the present teachings, examples of which are illustrated in the accompanying drawings. Wherever possible, the same reference numbers will be used throughout the drawings to refer to the same or like parts.

DETAILED DESCRIPTION

The embodiments relate generally to efficiency enhancement and slew rate control in DC-DC converters.

Figure 1:
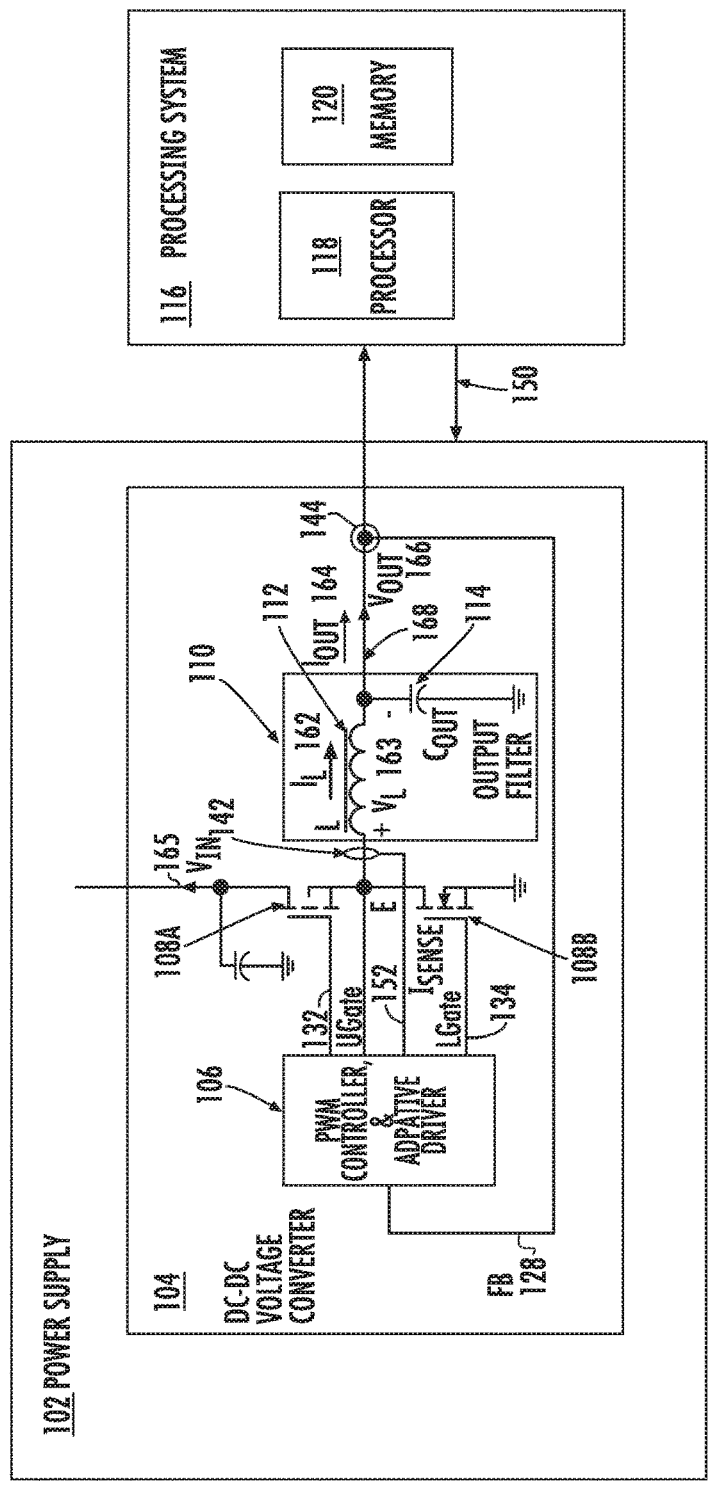
FIG. 1 illustrates an embodiment of an electrical system.

FIG. 1 illustrates an exemplary electrical system 100 comprising a load, e.g. a processing system 116, and power supply 102 that includes a voltage converter, e.g. a DC-DC voltage converter 104. The processor 118 can be electrically coupled to, communicate with, and/or control the voltage converter through a data bus 150. This electrical system 100 may be a device related to telecommunications, automobiles, semiconductor test and manufacturing equipment, consumer electronics, or any type of electronic equipment.

The power supply 102 may be AC to DC power supply, or a DC supply powered by a battery. In one embodiment, the processing system 116 may include a processor 118 and memory 120 which are coupled to one another. In another embodiment, the processor 118 may be one or more microprocessors, microcontrollers, embedded processors, digital signal processors, or a combination of two or more of the foregoing. The memory 120 may be one or more volatile memories and/or non-volatile memories such as static random access memory, dynamic random access memory, read only memory, flash memory, or a combination of two or more of the foregoing. The DC-DC voltage converter 104 provides a voltage to the load that may be more precise than a voltage provided by other voltage sources such as low drop out regulators.

The DC-DC voltage converter 104 illustrated in FIG. 1 is one embodiment of a current mode DC-DC voltage converter. Current mode DC-DC voltage converters are widely used because they may be easier to implement and utilize than alternatives, such as voltage mode DC-DC voltage converters. Also, current mode DC-DC voltage converters may have fixed clock frequencies which generate less radio frequency interference then voltage converters that have variable clock frequencies.

One embodiment of a current mode DC-DC voltage converter will now be described. The DC-DC voltage converter 104 includes a pulse width modulation ('PWM') controller and adaptive driver 106, power transistors, e.g. upper metal oxide semiconductor field effect transistor ('MOSFET') 108A and a lower MOSFET 108B, and an output filter 110. The PWM controller and adaptive driver 106 is advantageously implemented with an embodiment of a driver with adaptive dead time control as will be further described below.

The PWM controller and adaptive driver 106 generates UGate control signal 132 (UGate) and an LGate control signal 134 (LGate) that are respectively coupled to inputs of the upper MOSFET 108A and the lower MOSFET 108B. UGate control signal 132 and an LGate control signal 134 respectively cause the upper MOSFET 108A and the lower MOSFET 108B to alternatively switch on and off. The output filter 110 may include a series inductor 112 and shunt capacitor 114. The DC-DC voltage converter 104 has a converter output 168 with a corresponding output voltage 166, $V_{OUT}$, and output current, $I_{OUT}$, 164.

In one embodiment, a current sensor 142 is coupled to a terminal of the inductor 163 of the output filter 110. The current sensor 142 generates an inductor current sense signal 152, $I_{SENSE}$, representative of the inductor current 162, $I_L$. The current sensor 142 and corresponding inductor current sense signal 152 are coupled to the PWM controller and adaptive driver 106. In another embodiment, the inductor current 162 and inductor current sense signal 152 have triangular or saw tooth waveforms. In an alternative embodiment, the inductor current sense signal 152 may be synthesized, rather than sensed; this technique is illustrated in U.S. Pat. No. 6,791,306 which is hereby incorporated by reference.

In one embodiment, a voltage sensor 144 is coupled to the converter output 168. The voltage sensor 144 generates an output voltage sense signal 128, FB, representative of the output voltage 166.

In one embodiment, the upper MOSFET 108A and the lower MOSFET 108B are powered by the power supply 102. In another embodiment, the power supply 102 provides an input voltage 165, $V_{IN}$, which is coupled to the drain of the upper MOSFET 108A. In yet a further embodiment, the input voltage 165 is a direct current ('DC') voltage provided by the power supply 102.

Figure 2:
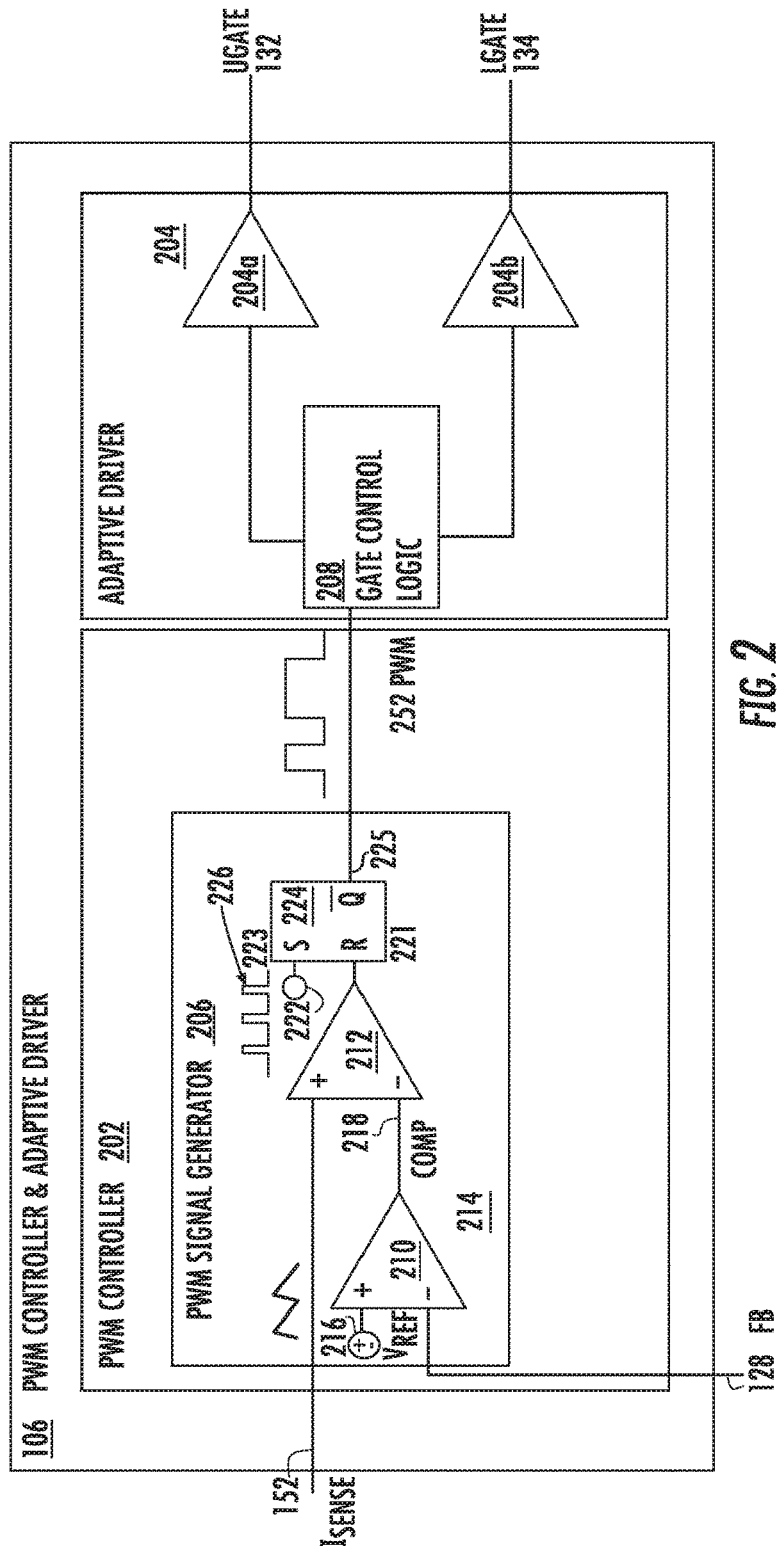
FIG. 2 illustrates an embodiment of a PWM controller and driver.

FIG. 2 illustrates one embodiment of the PWM controller and adaptive driver 106 including a PWM controller 202 and an adaptive driver 204. As described in more detail below, the adaptive driver 204 is advantageously implemented with an embodiment of a driver with adaptive dead time control which are illustrated below with respect to FIGS. 3, 4, 5, 6 and 7.

The PWM controller 202 includes a PWM signal generator 206 which generates a PWM signal 252 (PWM). In one embodiment, an input of a Gate control logic 208 is configured to receive the PWM signal 252. In one embodiment, the Gate control logic 208 is used to convert the PWM signal 252 to signals that control the adaptive driver 204 and turn the upper and lower MOSFETs 108A, 108B on and off. In a further embodiment, the Gate control logic 208 can be partially in the PWM Controller 202 and partially in the adaptive driver 204. In another embodiment, the Gate Control logic 208 is located within the PWM controller 202.

In a further embodiment, the adaptive driver 204 includes a first driver 204a, and a second driver 204b, e.g. including voltage level shifters, having inputs respectively coupled to outputs of the Gate control logic 208. The adaptive driver's 204 two drivers 204a, 204b have outputs, which provide the UGate control signal 132 and the LGate control signal 134 respectively to, and are coupled to, the upper MOSFET 108A and the lower MOSFET 108B.

In one embodiment, the PWM signal generator 206 includes an error amplifier 210 which is part of a feedback loop intended to drive the output voltage 166 to the desired output voltage. The reference voltage 216 is representative of the desired output voltage of the DC-DC voltage converter 104. In one embodiment the reference voltage is the desired output voltage or a voltage proportional to the desired output voltage. In one embodiment of the error amplifier 210, the negative input 214 of the error amplifier 210 is configured to be coupled to the output voltage sense signal 128. The positive input of the error amplifier 210 is configured to be coupled to the reference voltage 216. The reference voltage 216 may be specified by the designer of the power supply 102. The reference voltage 216 may be generated in the PWM signal generator 206, elsewhere in the PWM Controller and adaptive driver 106, or be provided by an external source.

The voltage difference between the reference voltage 216 and the voltage level of the output voltage sense signal 128 is the voltage of the COMP signal 218, COMP. The output of the error amplifier 210 is configured to provide the COMP signal 218.

In one embodiment, the negative input of a PWM comparator 212 is configured to receive the COMP signal 218. The positive input of the PWM comparator 212 is configured to receive the inductor current sense signal 152. The Reset input 221 of a PWM SR flip flop 224 is configured to receive a signal provided by the output of the PWM comparator 212. A Set input 223 of the PWM SR flip flop 224 is configured to receive a clock signal 226 from a clock signal generator 222. The complementary output 225, Q bar, of the PWM SR flip flop 224 provides the PWM signal 252. In another embodiment, the PWM SR flip flop 224 may have a non-complementary output which provides a complementary PWM signal. In another embodiment, for voltage mode control, the inductor current sense signal 152 is replaced by a triangular shaped or saw tooth shaped waveform that may be generated by the clock signal generator 222.

In one embodiment, the PWM controller and adaptive driver 106 is fabricated on a single integrated circuit (IC). Alternatively, the PWM controller and adaptive driver 106 may be fabricated on separate ICs, e.g. with the PWM controller and driver fabricated on separate ICs. In a further embodiment, the upper MOSFET 108A and the lower MOSFET 108B may be fabricated on a single IC. In yet another embodiment, the upper MOSFET 108A and lower MOSFET 108B may be fabricated on the same IC as the PWM controller and adaptive driver 106. In yet a further embodiment, the Gate Control Logic 208 can be fabricated on the same IC as the adaptive driver 204, where the adaptive driver 204 and the remainder of the circuitry of the PWM Controller 202 are fabricated on a separate IC. In a further embodiment, at least one of the upper MOSFET 108A and the lower MOSFET 108B, and the adaptive driver 204 are fabricated on separate semiconductor substrates.

For DC-DC voltage converters 104, it is desirable to reduce ringing of UGate control signal 132 and LGate control signal 134, reduce electromagnetic interference, and adjust the slew rate of UGate control signal 132 and LGate control signal 134. It is also desirable to have adaptive dead time control so that dead time only occurs when needed; this improves DC-DC voltage converter efficiency. Dead time prevents both MOSFETs being turned on at the same time, preventing shoot through current which can also cause MOSFET failure.

Figure 3A:
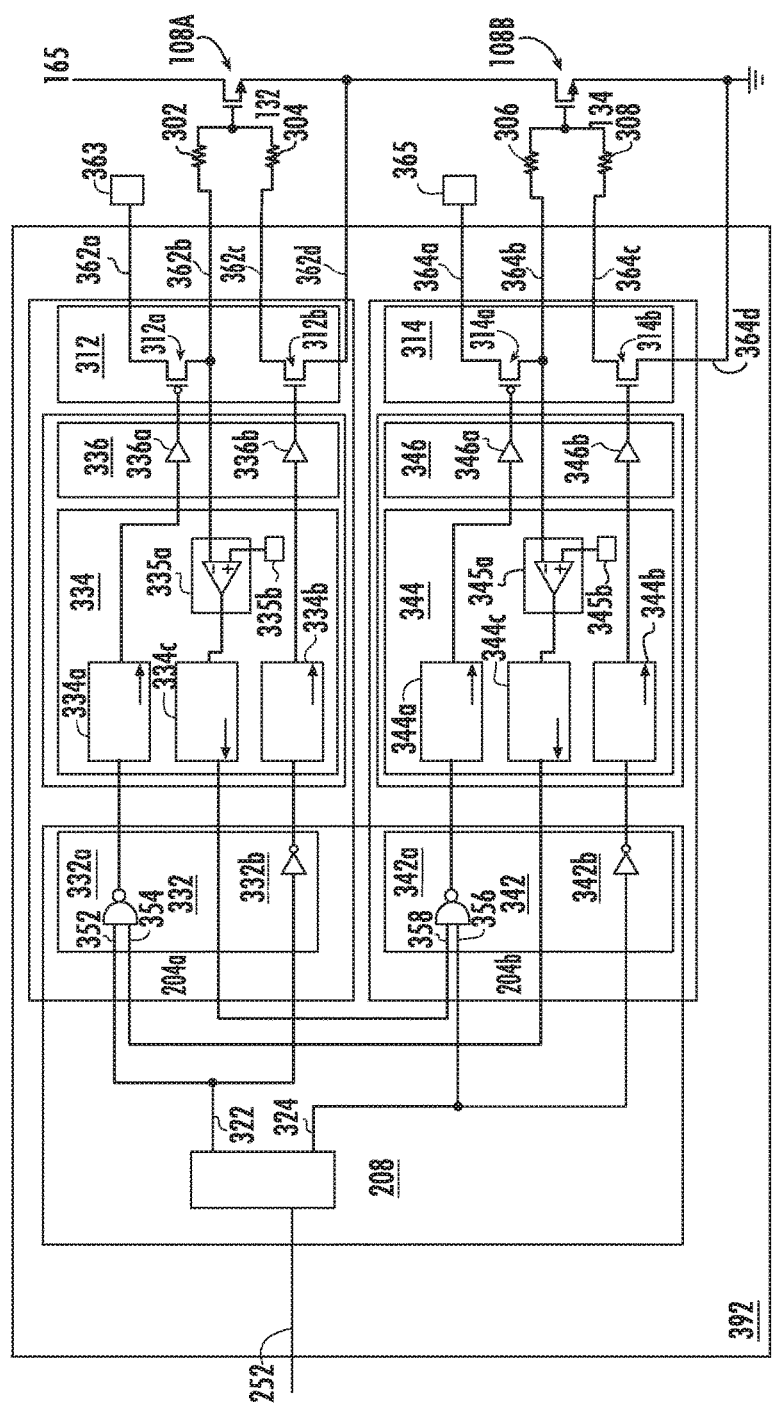
FIG. 3a illustrates an embodiment of a driver with adaptive dead time, slew resistors and power transistors.

FIG. 3a illustrates one embodiment of a driver with adaptive dead time control 392, slew resistors 302, 304, 306, 308, and upper and lower MOSFETs 108A, 108B. The slew resistors 302, 304, 306, and 308 permit independently adjusting the slew rate of rising and falling edges of UGate control signal 132 and LGate control signal 134. By increasing the resistance of a resistor in series with the input of the power transistor, the slew rate of the gate voltage is decreased but ringing of the gate voltage, and the resulting electromagnetic interference, are reduced. This can be accomplished separately for the rising and falling edges by using two separate resistors, each of which is used only for one such edge.

This permits a designer of the power supply 102 to trade off reduction in DC-DC voltage converter ringing and EMI, and improvement in efficiency performance, i.e. increased gate resistance reduces ringing and EMI, but may decrease efficiency. Because the driver with adaptive dead time control 392 also permits sensing of the gate voltages of the Upper MOSFET 108A and the Lower MOSFET 108B, it also permits adaptively reducing dead time while still preventing shoot-through. Reducing dead time this way enhances the efficiency of the DC-DC voltage converter 104.

In one embodiment, independent slew rate control of the rising and falling edges of the UGate control signal 132 and LGate control signal 134 is achieved as follows. A first slew resistor 302 is uniquely coupled between a first voltage source and a gate of the upper MOSFET 108A when the UGate control signal 132 begins respectively transitioning from a lower voltage to a higher voltage. The resistance of the first slew resistor 302 and the input capacitance of the upper MOSFET 108A establish the slew rate of the rising edge of UGate control signal 132. The voltage on the gate of the upper MOSFET 108A charges in accordance with the RC time constant formed by the resistance of the first slew resistor 302, and the input capacitance. In the embodiment shown in FIG. 3a, the on resistance of the first control transistor 312a may also affect the slew rate. Typically, however, the on resistance is much lower than the value of the first slew resistor 302, and the on resistance contribution to the slew rate is practically negligible.

A second slew resistor 304 is uniquely coupled between a second voltage source, e.g. ground, and the gate of the upper MOSFET 108A when the UGate control signal 132 begins respectively transitioning from the higher voltage to a lower voltage. The resistance of the second slew resistor 304 and the input capacitance of the upper MOSFET 108A establish the slew rate of the falling edge of UGate control signal 132. The voltage on the gate of the upper MOSFET 108A discharges in accordance with the RC time constant formed by the resistance of the second slew resistor 304, and the input capacitance. Here too, as described above, the contribution of Rdson is practically negligible. The same technique of using two slew resistors is also used with the lower MOSFET 108B and the LGate control signal 134.

Using the above technique, in one embodiment, the driver with adaptive dead time control 392 can monitor the gate voltage of a MOSFET, e.g. the upper MOSFET 108A, directly during the turn off process through the first slew resistor 302 (through which no current flows when the upper MOSFET 108A is turning off). The gate discharge current is conducted by the second slew resistor 304 during the turn off process. Without the monitored gate voltage being influenced by the voltage drop across the second slew resistor 304, the direct gate voltage sensing disclosed herein is more accurate. This results in more precise dead time control, and therefore higher efficiency. Thus, the driver with adaptive dead time control 392 can turn on the other MOSFET, e.g. the lower MOSFET 108B, only when the original MOSFET is turned off, based upon direct sensing of the gate voltage of original MOSFET, e.g. upper MOSFET 108a. More specifically, in one embodiment, when one of the MOSFETs, e.g. the upper MOSFET 108A, is turned off, and its gate is discharging through the second slew resistor 304, the gate voltage can be monitored and sensed by the first comparator 335a through the first slew resistor 302. The first comparator 335a may also be referred to as a first threshold sense circuit. Only when the gate voltage drops below a first threshold level 335b (e.g. a reference voltage) at which the MOSFET is turned off, e.g. a threshold voltage of the corresponding MOSFET, will the other MOSFET, e.g. the lower MOSFET 108B, be turned on. Thus shoot through current is avoided.

In one embodiment, the driver with adaptive dead time control 392 includes Gate Control Logic 208. The input of the Gate Control Logic 208 is configured to receive a PWM signal 252 from an output of the PWM Controller 202. Alternatively, the input of the Gate Control Logic 208 can be configured to receive a non-complementary output and a complementary output 225 of the PWM SR Flip Flop 224. In a further embodiment, two outputs of the Gate Control Logic 208 are configured to provide two complementary signals: a High Side Enable signal 322 and a Low Side Enable signal 324. In yet a further embodiment, an input of the driver with adaptive dead time control 392 is configured to receive a High Side Enable signal 322 and Low Side Enable signal 324 generated in the PWM Controller 202.

An input of the first driver 204a is configured to be coupled to the High Side Enable signal 322. In one embodiment, the first driver 204a includes a first logic block 332, a first set of voltage level shifters 334, a first set of buffer amplifiers 336, and a first set of control transistors 312.

An input of the second driver 204b is configured to be coupled to the Low Side Enable signal 324. In one embodiment, the second driver 204b includes a second logic block 342, a second set of voltage level shifters 344, a second set of buffer amplifiers 346, and a second set of control transistors 314.

In one embodiment, the first and second drivers 204a, 204b modify the lower level voltages in the digital signal domain, e.g. the High Side Enable signal 322 and Low Side Enable signal 324, and the higher voltage levels of the power transistor domain, e.g. the signals needed to control the switching operation of the upper and lower MOSFETs 108A, 108B. This facilitates the interoperability between both domains. The first and second set of buffer amplifiers 336, 346 isolate the input impedances of the upper and lower MOSFETs 108A, 108B from impedances of the first and second set of voltage level shifters 334, 344. Along with other circuitry, the first and second set of control transistors 312, 314 and first and second logic blocks 332, 342 switch on and off the upper and lower MOSFETs 108A, 108B in a manner achieving adaptive dead time control as described above.

Referring again to FIG. 3a, one embodiment of the first driver 204a will now be described. In one embodiment, the first input terminal and a second input terminal of the first logic block 332 are configured to receive the High Side Enable Signal 322. A first input terminal and a second input terminal of the first set of voltage level shifters 334 are configured to be respectively coupled to a first output terminal and a second output terminal of the first logic block 332. A first input terminal and second input terminal of a first set of buffer amplifiers 336 are configured to be respectively coupled to a first output terminal and a second output terminal of the first set of voltage level shifters 334. A first input terminal and a second input terminal of the first set of control transistors 312 are configured to be respectively coupled to a first output terminal and a second output terminal of the first set of buffer amplifiers 336.

The first set of control transistors 312 has a first, second, third and fourth output terminals 362a, 362b, 362c, 362d. The second output terminal 362b and the third output terminal 362c of the first set of control transistors 312 is configured to be coupled respectively to the first terminals of a first slew resistor 302 and a second slew resistor 304. Second terminals of the first slew resistor 302 and the second slew resistor 304 are configured to be coupled to the gate of the upper MOSFET 108A. When a first control transistor 312a of the first set of control transistors 312 is turned off, through second control transistor 312b and second slew resistor 304, the gate voltage of the upper MOSFET 108A is sensed at the second output terminal 362b through the first slew resistor 302 which carries substantially no current during the turn off process.

In one embodiment, the first logic block 332 includes a NAND gate 332a and a logic inverter 332b. A first input terminal 352 of the NAND gate 332a is configured to be coupled to a first input terminal of the first logic block 332. Such first input terminal 352 may also be referred to as a first enable input. The first input terminal of the first logic block 332 is coupled to the High Side Enable signal 322.

A second input terminal 354 of the NAND gate 332a is configured to be coupled to a third input terminal of the first logic block 332. Such second input terminal 354 may also be referred to as a first enable input. A first output of the first logic block 332 is configured to be coupled to an output terminal of the NAND gate 332a. A first input terminal of the first set of voltage level shifters 334 is configured to be coupled to the first output of the first logic block 332.

An input terminal of the logic inverter 332b is configured to be coupled to a second input terminal of the first logic block 332. A second output of the first logic block 332 is configured to be coupled to an output terminal of the logic inverter 332b. A second input terminal of the first set of voltage level shifters 334 is configured to be coupled to the output terminal of the logic inverter 332b. A second input terminal of the first set of voltage level shifters 334 is configured to be coupled to the second output of the first logic block 332.

The first set of voltage level shifters 334 includes three voltage level shifters 334a, 334b, 334c. An input terminal of a first voltage level shifter 334a is configured to be coupled to the first input terminal of the first set of voltage level shifters 334. An input terminal of the second voltage level shifter 334b is configured to be coupled to the second input terminal of the first set of voltage level shifters 334. A first output terminal of the first set of voltage level shifters 334 is configured to be coupled to an output terminal of the first voltage level shifter 334a. A second output terminal of the first set of voltage level shifters 334 is configured to be coupled to the output terminal of a second voltage level shifter 334b.

The first set of buffer amplifiers 336 includes two buffer amplifiers 336a, 336b. An input terminal of a first buffer amplifier 336a is configured to be coupled to a first input terminal of the first set of buffer amplifiers 336. An input terminal of a second buffer amplifier 336b is configured to be coupled to a second input terminal of the first set of buffer amplifiers 336. A first output terminal of the first set of buffer amplifiers 336 is configured to be coupled to an output terminal of the first buffer amplifier 336a. A second output terminal of the first set of buffer amplifiers 336 is configured to be coupled to an output terminal of the first buffer amplifier 336a.

The first set of control transistors 312 includes two control transistors 312a, 312b, e.g. MOSFETs. Each of those two control transistors 312a, 312b may be formed by the parallel connection of multiple transistors, e.g. multiple MOSFET. An input terminal, e.g. a gate, of the first control transistor 312a is configured to be coupled to a first input terminal of the first set of control transistors 312. An input terminal of a second control transistor 312b is configured to be coupled to a second input terminal of the first set of control transistors 312. A first output terminal 362a of the first set of control transistors 312 is configured to be coupled to a first output terminal, e.g. a source, of the first control transistor 312a.

A first output terminal 362a is configured to be coupled to a first supply voltage 363. In one embodiment, as illustrated in FIG. 3b, the first supply voltage 363 can be a voltage of a bootstrap capacitor 372 coupled across the first output terminal 362a and a fourth output terminal 362d of a first set of control transistors 312. In one embodiment, the bootstrap capacitor 372 value can range from 0.1 microfarads to 1 microfarad. In another embodiment, the bootstrap capacitor 372 can have a value of 0.22 microfarads. The bootstrap capacitor 372 may be charged to the voltage level of the second supply voltage 365 when the lower MOSFET 108B is turned on. Thus, the bootstrap capacitor 372 is charged when the upper MOSFET 108A is turned on.

In another embodiment, e.g. when the upper MOSFET 108A is a p-type MOSFET, the first supply voltage 363 may be the same as the second supply voltage. In a further embodiment one or more supply voltages can be provided in the driver with adaptive dead time control 392, or externally to the driver with adaptive dead time control 392.

A second output terminal 362b of the first set of control transistors 312 is configured to be coupled to a second output terminal, e.g. a drain, of the first control transistor 312a. A third output terminal 362c of the first set of control transistors 312 is configured to be coupled to a first output terminal, e.g. a drain, of the second control transistor 312b. In one embodiment, the first control transistor 312a and the second control transistor 312b are respectively P-type and N-type MOSFETs. The fourth output terminal 362d of the first set of control transistors 312 is configured to be coupled to a second output terminal, e.g. a source, of the second control transistor 312b. An output terminal, e.g. source, of the upper MOSFET 108A is configured to be coupled to a fourth output terminal 362d.

A third input terminal of the first set of voltage level shifters 334 is configured to be coupled to the second output terminal 362b of the first set of control transistors 312. Through this circuitry the driver with adaptive dead time control 392 determines if the upper MOSFET 108A is off, and thus whether to turn on the lower MOSFET 108B.

In one embodiment, a negative input of a first comparator 335a is configured to be coupled to the second output terminal 362b of the first set of control transistors 312. A positive input of the first comparator 335a is configured to be coupled to a first threshold level 335b. In one embodiment, an input of a third voltage level shifter 334c is configured to be coupled to an output of the first comparator 335a. A third output terminal of the first set of voltage level shifters 334 is configured to be coupled to an output terminal of the third voltage level shifter 334c.

One embodiment of the second driver 204b will now be illustrated. In one embodiment, a first input terminal and a second input terminal of the second logic block 342 are configured to receive the Low Side Enable Signal 324. A third input terminal of the second logic block 342 is configured to be coupled to the third output terminal of the first set of voltage level shifters 334.

A first input terminal and a second input terminal of the second set of voltage level shifters 344 are configured to be coupled respectively to a first output terminal and a second output terminal of the second logic block 342. A first input terminal and a second input terminal of a second set of buffer amplifiers 346 are configured to be coupled respectively to a first output terminal and a second output terminal of the second set of voltage level shifters 344. A first input terminal and a second input terminal of the second set of control transistors 314 are configured to be coupled respectively to a first output terminal and a second output terminal of the second set buffer amplifiers 346.

The second set of control transistors 314 has a first, second, third and fourth output terminals 364a, 364b, 364c, 364d. The second output terminal 364b and the third output terminal 364c of the second set of control transistors 314 are configured to be coupled to first terminals of a third slew resistor 306 and a fourth slew resistor 308. Second terminals of the third slew resistor 306 and fourth slew resistor 308 are configured to be coupled to a gate of the lower MOSFET 108B. During the process of turning off the lower MOSFET 108B, the gate capacitor of the lower MOSFET 108b is discharged through a fourth control transistor 314b and the fourth slew resistor 308. Because a third control transistor 314a of the second set of control transistors 314 is turned off during the process of turning off the lower MOSFET 108b, the gate voltage of the lower MOSFET 108B can be directly sensed at the second output terminal 364b through the third slew resistor 306 which carries substantially no current during the turn off process.

In one embodiment, the second logic block 342 includes a NAND gate 342a and a logic inverter 342b. A first input terminal 356 of the NAND gate 342a is configured to be coupled to a first input terminal of the second logic block 342. Such first input terminal 356 may also be referred to as a second enable input. The first input terminal of the second logic block 342 is coupled to the Low Side Enable signal 324.

A second input terminal 358 of the NAND gate 342a is configured to be coupled to a third input terminal of the second logic block 342. Such second input terminal 358 may also be referred to as a second feedback input. A first output of the second logic block 342 is configured to be coupled to an output terminal of the NAND gate 342a. A first input terminal of the second set of voltage level shifters 344 is configured to be coupled to the first output of the second logic block 342.

An input terminal of the logic inverter 342b is configured to be coupled to a second input terminal of the second logic block 342. A second output of the second logic block 342 is configured to be coupled to an output terminal of the logic inverter 342b. A second input terminal of the second set of voltage level shifters 344 is configured to be coupled to the second output of the second logic block 342.

The second set of voltage level shifters 344 includes three voltage level shifters 344a, 344b, 344c. An input terminal of the fourth voltage level shifter 344a is configured to be coupled to a first input terminal of the second set of voltage level shifters 344. An input terminal of a fifth voltage level shifter 344b is configured to be coupled to a second input terminal of the second set of voltage level shifters 344. A first output terminal of the second set of voltage level shifters 344 is configured be coupled to an output terminal of the fourth voltage level shifter 344a. A second output terminal of the second set of voltage level shifters 344 is configured to be coupled to an output terminal of the fifth voltage level shifter 344b.

The second set of buffer amplifiers 346 includes two buffer amplifiers 346a, 346b. An input terminal of a third buffer amplifier 346a is configured to be coupled to a first input terminal of the second set of buffer amplifiers 346. An input terminal of a fourth buffer amplifier 346b is configured to be coupled to a second input terminal of the second set of buffer amplifiers 346. A first output terminal of the second set of buffer amplifiers 346 is configured to be coupled to an output terminal of the third buffer amplifier 346a. A second output terminal of the second set of buffer amplifiers 346 is configured to be coupled to an output terminal of the fourth buffer amplifier 346b.

The second set of control transistors 314 includes the third and fourth control transistors 314a, 314b, e.g. MOSFETs. Each of those two control transistors 314a, 314b may be formed by the parallel connection of multiple transistors, e.g. multiple MOSFET transistors. An input terminal, e.g. a gate, of the third control transistor 314a is configured to be coupled to a first input terminal of the second set of control transistors 314. An input terminal of a fourth control transistor 314b is configured to be coupled to a second input terminal of the second set of control transistors 314. A first output terminal 364a of the first set of control transistors 314 is configured to be coupled to a first output terminal, e.g. a source, of the third control transistor 314a. In one embodiment, a first output terminal 364a is coupled to a second supply voltage 365. In one embodiment, the second supply voltage 365 can be in the driver with adaptive dead time control 392; in another embodiment, the second supply voltage 365 can be external to the driver with adaptive dead time control 392. A second output terminal 364b of the second set of control transistors 314 is configured to be coupled to a second output terminal, e.g. a drain, of the third control transistor 314a. A third output terminal 364c of the second set of control transistors 314 is configured to be coupled to a first output terminal, e.g. a drain, of the fourth control transistor 314b. A fourth output terminal 364d of the first set of control transistors 314 is configured to be coupled to a second output terminal, e.g. a source, of the fourth control transistor 314b. In one embodiment, the third control transistor 314a and the fourth control transistor 314b are respectively P-type and N-type MOSFETs. An output terminal, e.g. source, of the lower MOSFET 108B is configured to be coupled to a second output terminal, e.g. a source, of the fourth control transistor 314b.

A third input terminal of the second set of voltage level shifters 344 is configured to be coupled to a second output terminal 364b of the second set of control transistors 314. Through this circuitry the driver with adaptive dead time control 392 determines if the lower MOSFET 108B is off, and thus whether it can turn on the upper MOSFET 108A.

In one embodiment, a negative input of a second comparator 345a is configured to be coupled to the second output terminal 364b of the second set of control transistors 314. The second comparator 345a may also be referred to as a second threshold sense circuit. A second threshold level 345b, e.g. reference voltage, is coupled to the positive input of the second comparator 345a. In one embodiment, the first and second threshold levels 335b, 345b provide reference voltages that are respectively representative of the approximate value of threshold voltages (e.g., substantially equal to the threshold voltage) for the upper MOSFET 108A and the lower MOSFET 108B.

In one embodiment, an input of a sixth voltage level shifter 344c is configured to be coupled to an output of the second comparator 345a. In another embodiment, a third output terminal of the second set of voltage level shifters 344 is configured to be coupled to an output of the second comparator 345a. The third output terminal of the second set of voltage level shifters 344 is coupled to an output terminal of the sixth voltage level shifter 344c. A third input terminal of the first logic block 332 is coupled to the third output terminal of the second set of voltage level shifters 344.

Adaptive dead time control is implemented via first comparator 335a and second comparator 345a the following way. When turning off the upper MOSFET 108a the output of first comparator 335a is logic LOW as long as the gate voltage of upper MOSFET 108A, directly monitored by the inverting input of first comparator 335a via first slew resistor 302, is higher than the first threshold level 335b. As the output of first comparator 335a is coupled to an input of the NAND gate 342a (through the third voltage level shifter 334c) the lower MOSFET 108B is prevented from being turned on until the output of the first comparator 335 becomes logic HIGH, i.e. until the directly monitored gate voltage of upper MOSFET 108a drops below the first threshold level 335b, indicating that the upper MOSFET 108a is fully off (conducting substantially no current). Hence, the circuit prevents turning on the lower MOSFET 108b until upper MOSFET 108a is fully turned off, thereby preventing cross conduction. Similarly, the second comparator 345a prevents the turn on of upper MOSFET 108A until lower MOSFET 108b fully turns off as its output being coupled to an input of NAND gate 332a and by directly monitoring the gate voltage of lower MOSFET 108B through the third slew resistor 306.

Figure 4:
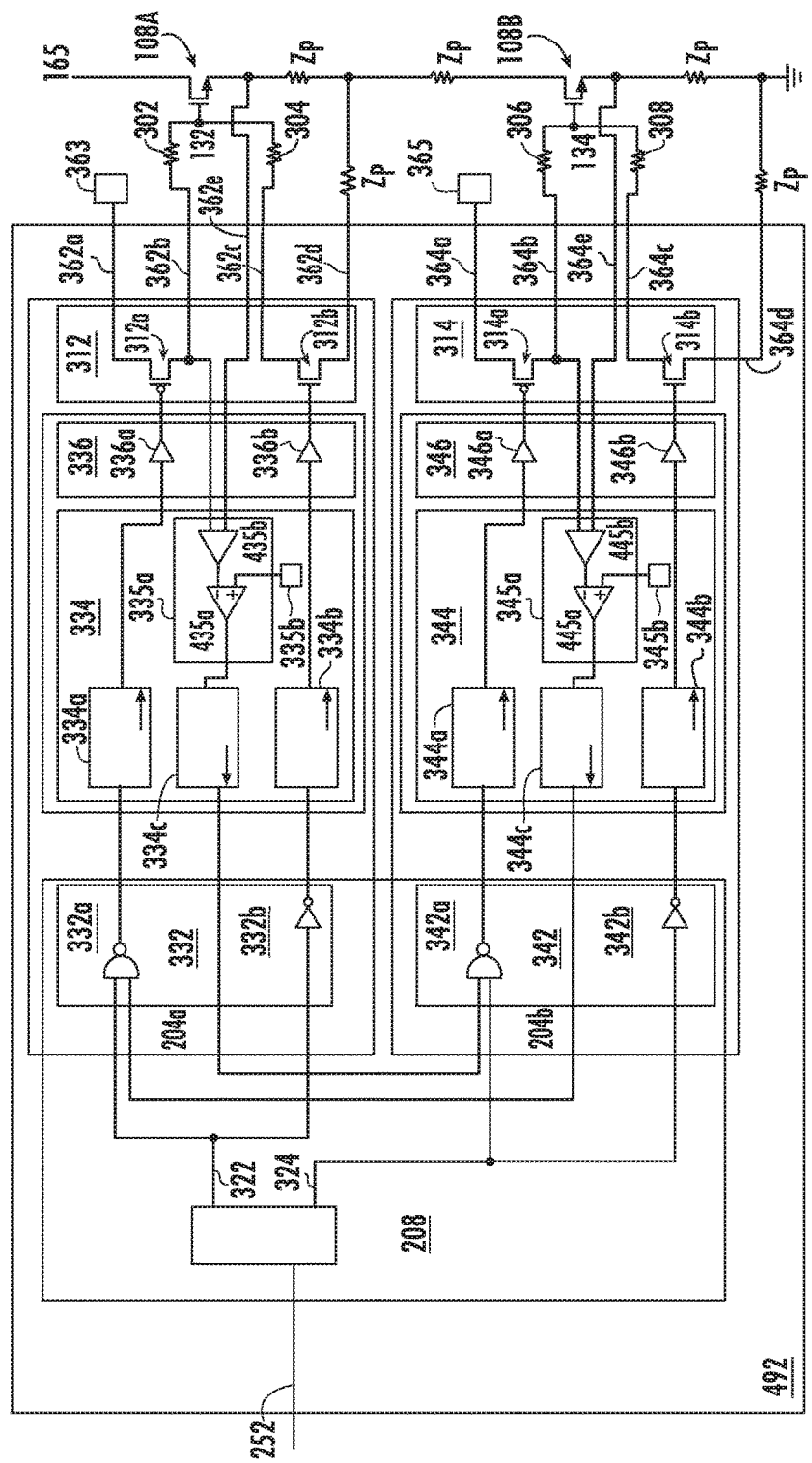
FIG. 4 illustrates another embodiment of a driver, slew resistors and power transistors.

In another embodiment of the driver with adaptive dead time control 492, illustrated in FIG. 4, fifth input terminals 362e, 364e are added respectively to the first and second set of voltage level shifters 334, 344. The fifth input terminals 362e, 364e are configured to be coupled respectively to the sources of the upper MOSFET 108A and the lower MOSFET 108B. In one embodiment, such coupling is made as close as practically possible to such sources. This diminishes the effects of parasitic impedances ZP in practical circuit implementations. As a result, the driver with adaptive dead time control's 492 noise immunity is increased, and its measurement accuracy of the gate to source voltages of the upper and lower MOSFETs 108A, 108B is enhanced. This permits more accurate dead time control, and higher efficiency circuit performance.

In one embodiment, illustrated in FIG. 4, the first and second comparators 335a, 345a respectively include first and second differential amplifiers 435b, 445b, and third and fourth comparators 435a, 445a. Differential inputs of the first and second differential amplifiers 435b, 445b are configured to be coupled to the second output terminals 362b, 364b, and the fifth input terminals 362e, 364e. Negative inputs of third and fourth comparators 435a, 445a are respectively coupled to outputs of the first and second differential amplifiers 435b, 445b are coupled respectively to the n.

Figure 5:
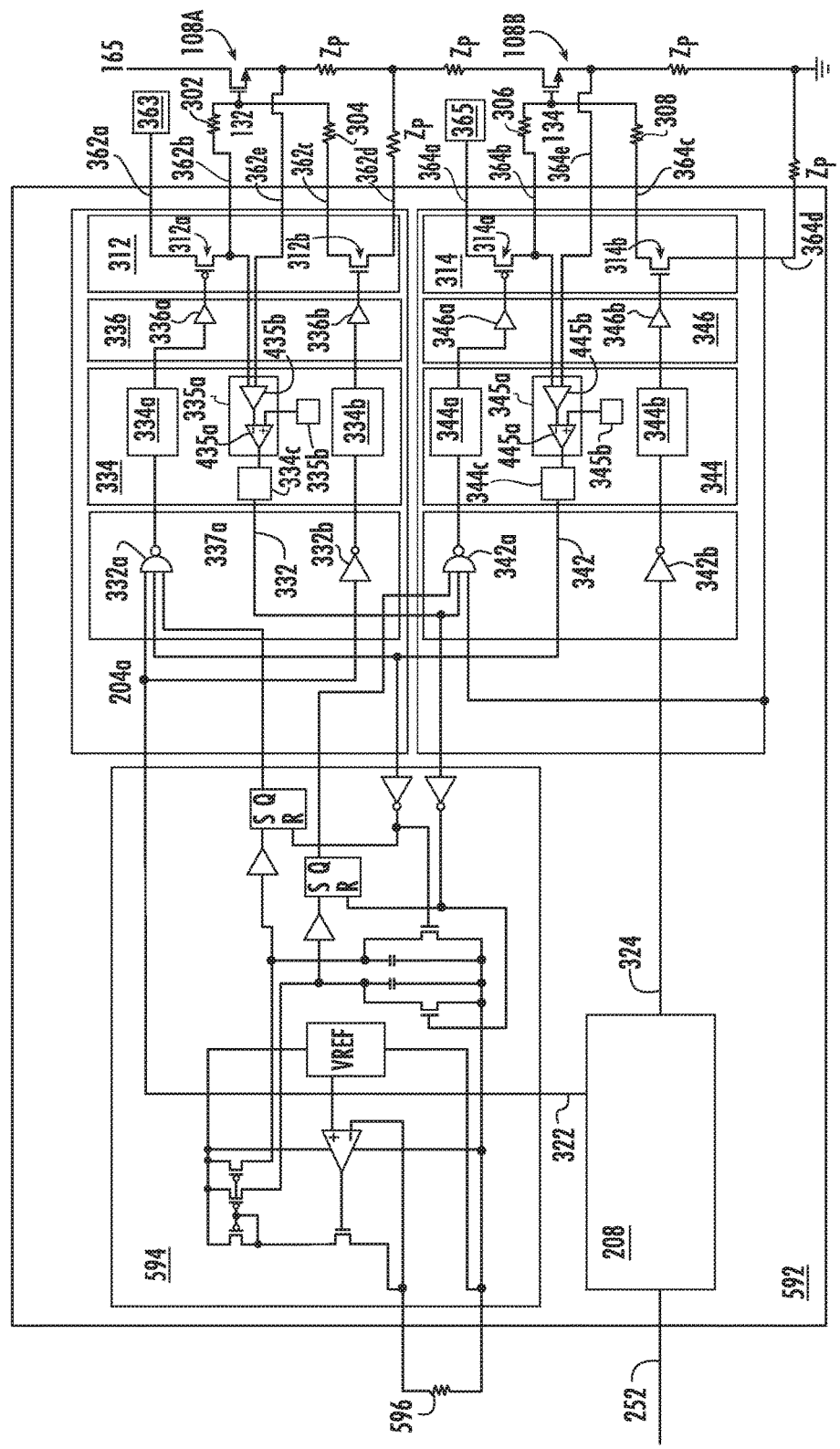
FIG. 5 illustrates yet another embodiment of a driver with adaptive dead time, slew resistors and power transistors.

In yet a further embodiment, illustrated in FIG. 5, the driver with adaptive dead time control 592 includes programmable dead time circuitry 594. The programmable dead time circuitry 594 is well known to those skilled in the art, and facilitates a user settable dead time. Should the user settable dead time be too short and risk shoot through, the adaptive dead time circuitry illustrated above will increase the dead time to prevent such shoot through. The programmable dead time can be configured by choosing a suitable resistance for the external resistor 596 configured to be coupled to the programmable dead time circuitry 594. As illustrated in FIG. 5, outputs of the programmable dead time circuitry 594 are configured to be coupled to an existing and a new input to the first and second logic blocks 332, 342, and the NAND gates 332a, 342a therein.

Figure 6:
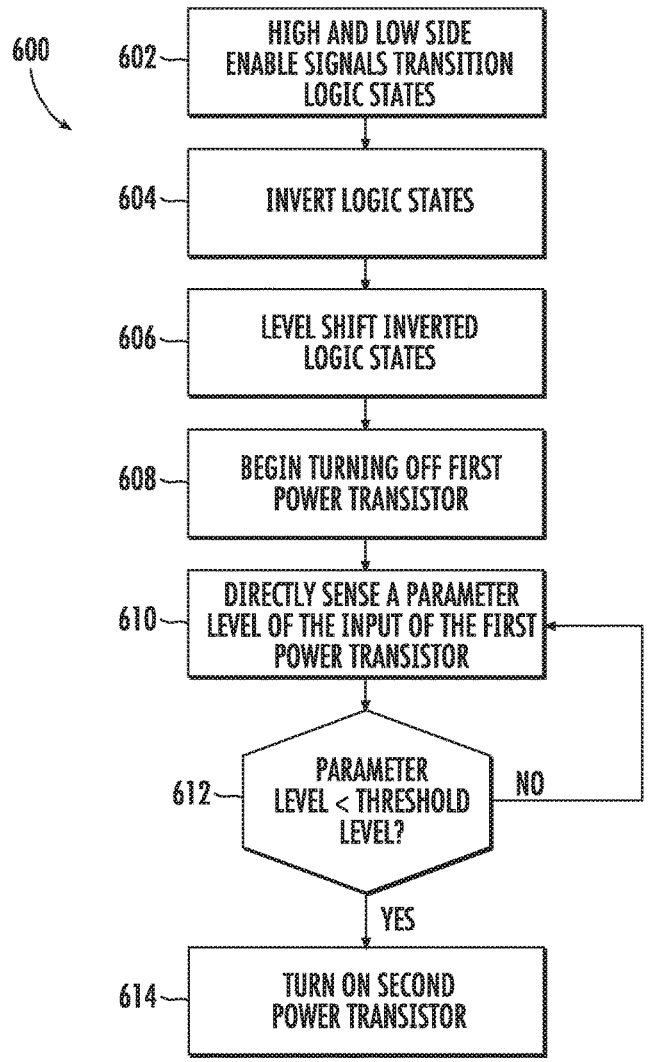
FIG. 6 illustrates one embodiment of operation of a driver with adaptive dead time.
Figure 7:
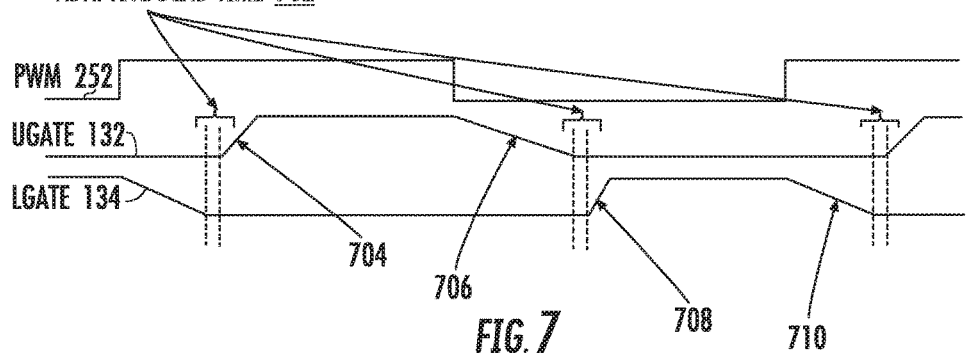
FIG. 7 is an illustration of signal waveforms related to a driver with adaptive dead time control.

FIG. 6 illustrates one embodiment of a method of operation 600 of the adaptive driver 204. For block 602, the High Side Enable signal 322 and a Low Side Enable signal 324 logic transition states. For block 604, the High and Low Side Enable signals 322, 324 logic states are inverted. For block 606, the inverted High and Low Side Enable signals 322, 324 have their voltage level shifted. For block 608, at least one of the inverted, level shifted High and Low Side Enable signals begins turning off a first power transistor (either the upper MOSFET 108A or lower MOSFET 108B). In one embodiment, this is facilitated by turning off the first control transistor 312a and turning on the second control transistor 312b of the first set of control transistors 312. For block 610, the inverted, level shifted High and Low Side Enable signals also commences the direct sensing of voltage parameter level, e.g. gate to source voltage, of the input of the first power transistor. For block 612, determine if the input parameter level of the first power transistor crosses, e.g. becomes less than, a threshold level, e.g. threshold voltage, of the first power transistor. If the parameter level of the input of the first power transistor does not cross than the threshold level of the first power transistor, then return to block 610. If the parameter level of the input of the first power transistor crosses the threshold level of the first power transistor, then in block 614 turn on the second power transistor (respectively either the lower MOSFET 108B or upper MOSFET 108A). Alternatively, in another embodiment of block 614, the second power transistor will only be turned on upon the earlier of the occurrence of the parameter level of the input of the first power transistor crossing the threshold level, and the end of a user defined time period starting after High and Low Side Enable signals 322, 324 transition logic states.

Exemplary signal waveforms of the following representative signals, for the embodiments described above, are illustrated in FIG. 7: PWM Signal (PWM) 252, UGate 132, and LGate 134. The rise time 704 of UGate 132 is established by the resistance of the first slew resistor 302, and the input gate capacitance and resistance of the upper MOSFET 108A. The waveforms show a linear voltage slew for illustrative purposes. The actual waveform may be exponential. The fall time 706 of UGate 132 is established by the resistance of the second slew resistor 304, and the input gate capacitance and resistance of the upper MOSFET 108A. The rise time 708 of LGate 134 is established by the slew resistance of the third slew resistor 306, and the input gate capacitance and resistance of the lower MOSFET 108B. The fall time 710 of LGate 134 is established by the resistance of the fourth slew resistor 308, and the input gate capacitance and resistance of the lower MOSFET 108B. The period of delay from when UGate 132 begins to transition low, and LGate 134 begins to transition high (or visa versa) is the illustrated adaptive dead time 702.

Although only a DC-DC buck voltage converter is illustrated, the invention may be implemented in other DC-DC voltage converter topologies, including without limitation boost converters and buck-boost converters. Further the invention may be used to implement motor drives, uninterruptable power supplies, power inverters, ballasts for lighting, and class D amplifiers.

EXAMPLE EMBODIMENTS

Example 1 includes an apparatus, comprising: a first driver having first and second inputs, and first and second outputs; wherein the first output is configured to be coupled to a first terminal of a first slew resistor having a second terminal coupled to an input of a first power transistor; wherein the second output is configured to be coupled to a third terminal of a second slew resistor having a fourth terminal coupled to the input of the first power transistor; a second driver having third and fourth inputs and third and fourth outputs; wherein the third output is configured to be coupled to a fifth terminal of a third slew resistor also having a sixth terminal coupled to an input of a second power transistor; wherein the fourth output is configured to be coupled to a seventh terminal of a fourth slew resistor also having an eighth terminal coupled to an input of the second power transistor; wherein the first output is coupled to the fourth input; wherein the third output is coupled to the second input; wherein the first input is configured to receive an enable signal; wherein the third input is configured to receive a complementary enable signal; wherein the first output is configured to directly sense a voltage at the input of the first power transistor upon the first power transistor beginning to be turned off; and wherein the third output is configured to directly sense a voltage at the input of the second power transistor upon the second power transistor beginning to be turned off.

Example 2 includes the apparatus of Example 1, wherein at least one of the first and second power transistors is a MOSFET.

Example 3 includes the apparatus of Example 1, further comprising programmable dead time circuitry coupled to the first driver and the second driver.

Example 4 includes the apparatus of Example 3, wherein the programmable dead time circuitry is configured to be coupled to a resistor whose value established a programmed dead time.

Example 5 includes the apparatus of Example 1, further comprising gate control logic.

Example 6 includes the apparatus of Example 1, wherein the first driver comprises a first comparator having seventh and eighth inputs, and a fifth output; wherein the second driver comprises a second comparator having ninth and tenth inputs, and a sixth output; wherein the first output is coupled to the seventh input; wherein the eighth input is configured to be coupled to a first reference voltage; wherein the fifth output is coupled to the fourth input; wherein the third output is coupled to the ninth input; wherein the tenth input is configured to be coupled to a second reference voltage; and wherein the sixth output is coupled to the second input.

Example 7 includes the apparatus of Example 6, wherein the first reference voltage is substantially equal to a threshold voltage of the first power transistor; and wherein the second reference voltage is substantially equal to a threshold voltage of the second power transistor.

Example 8 includes the apparatus of Example 6, further comprising a PWM controller coupled to the first driver and the second driver.

Example 9 includes the apparatus of Example 8, further comprising: the first slew resistor; the second slew resistor; the first power transistor having a first output terminal; wherein the first output is coupled to the first terminal; wherein the second terminal is coupled to an input of the first power transistor; wherein the second output is coupled to the third terminal; wherein the fourth terminal coupled to the input of the first power transistor; the third slew resistor; the fourth slew resistor; the second power transistor having a second output terminal coupled to the first output terminal; an output filter coupled to the first output terminal; wherein the third output is coupled to the fifth terminal; wherein the sixth terminal coupled to an input of the second power transistor; wherein the fourth output is coupled to the seventh terminal; and wherein the eighth terminal coupled to the input of the second power transistor.

Example 10 includes the apparatus of Example 9, wherein the first and second power transistors are MOSFETs.

Example 11 includes the apparatus of Example 9, further comprising: a bootstrap capacitor; seventh and eighth outputs of the first driver; and wherein the bootstrap capacitor is coupled to the seventh and eight outputs.

Example 12 includes the apparatus of Example 6, wherein the first comparator further comprises a third comparator having first and second comparator inputs and a first comparator output, and a first differential amplifier having first and second differential amplifier inputs and a first amplifier output; wherein the second comparator input is coupled to the eighth input; wherein the first amplifier output is coupled to first comparator input; wherein the first differential amplifier input is coupled to seventh input; wherein the second differential amplifier input is coupled to a second output terminal of the first power transistor; wherein the second comparator further comprises a fourth comparator having third and fourth comparator inputs and a second comparator output, and a second differential amplifier having third and fourth differential amplifier inputs and a second amplifier output; wherein the fourth comparator input is coupled to the tenth input; wherein the second amplifier output is coupled to a third comparator input; wherein the first differential amplifier input is coupled to the ninth input; and wherein the fourth differential amplifier input is coupled to a second output terminal of the first power transistor.

Example 13 includes the apparatus of Example 6, wherein the first reference voltage is substantially equal to a threshold voltage of the first power transistor; and wherein the second reference voltage is substantially equal to a threshold voltage of the second power transistor.

Example 14 includes a method, comprising: transitioning a logic state of at least one enable signal; begin turning off a first power transistor; directly sensing a parameter level of an input of the first power transistor; turning on a second power transistor when a parameter level is less than a threshold level.

Example 15 includes the method of Example 14, wherein turning on the second power transistor when the parameter level is less than a threshold level further comprises turning on the second power transistor when a gate voltage of the first power transistor is less than a reference voltage.

Example 16 includes the method of Example 15, wherein turning on the second power transistor when the gate voltage of the first transistor is less than the reference voltage further comprises turning on the second power transistor when gate to source voltage of the first power transistor is less than a threshold voltage of the first power transistor.

Example 17 includes the method of Example 14, wherein begin turning off the first power transistor further comprises begin turning off the first power transistor after a programmable time period if the programmable time period ends prior to the parameter level becoming less than the threshold level.

Example 18 includes the method of Example 14, further comprising level shifting the amplitude of logic states.

Example 19 includes the method of Example 18, wherein the level shifting the amplitude of logic states further comprises level shifting the voltage of the logic states.

Example 20 includes the method of Example 18, further comprising inverting the logic states.

Example 21 includes an adaptive driver driving input terminals of an upper power transistor and a lower power transistor coupled serially comprising: first and second gate driver outputs coupled to the input terminal of the upper power transistor through first and second slew resistors whereby the upper power transistor is turned on by current flowing through the first slew resistor and turned off by current flowing through the second slew resistor; third and fourth gate driver outputs coupled to the input terminal of the lower power transistor through third and fourth slew resistors whereby the lower power transistor is turned on by current flowing through the third slew resistor and turned off by current flowing through the fourth slew resistor; first and second comparators having inputs coupled to the input terminals of the upper and lower power transistors respectively through the first and the third slew resistors; and wherein the first and second comparators enable turning on of one of the upper or lower power transistors when a parameter level of an input of another one of the upper or lower power transistors has fallen below a threshold level.

Example 22 includes the adaptive driver of Example 21, wherein the upper and lower power transistors are MOSFETs and the threshold level is a threshold voltage of the MOSFET that has been substantially turned off.

Example 23 includes an apparatus, comprising: a first driver having a first enable input and a first feedback input, first and second outputs, and a first threshold sense circuit coupled to the first output; a second driver having a second enable input and a second feedback input, third and fourth outputs, and a second threshold sense circuit coupled to the third output; wherein the first threshold sense circuit is coupled to the second feedback input of the second driver; wherein the second threshold sense circuit is coupled to the first feedback input; a first slew resistor coupled to the first output; a second slew resistor coupled to the second output; a third slew resistor coupled to the third output; a fourth slew resistor coupled to the fourth output; a first power transistor coupled to the first slew resistor and the second slew resistor; a second power transistor coupled to the third slew resistor and the fourth slew resistor; and an output filter coupled to the first power transistor and the second power transistor.

Example 24 includes the apparatus of Example 23, further comprising a PWM controller coupled to the first driver and the second driver.

Example 25 includes the apparatus of Example 24, further comprising a load coupled to the output filter.

Example 26 includes the apparatus of Example 25, wherein the load comprises a processor coupled to a memory.

It will be evident to one of ordinary skill in the art that the processes and resulting apparatus previously described can be modified to form various apparatuses having different circuit implementations and methods of operation. Notwithstanding that the numerical ranges and parameters setting forth the broad scope of the present teachings are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less than 10" can assume negative values, e.g. −1, −2, −3, −10, −20, −30, etc.

While the present teachings have been illustrated with respect to one or more implementations, alterations and/or modifications can be made to the illustrated examples without departing from the spirit and scope of the appended claims. In addition, while a particular feature of the present disclosure may have been described with respect to only one of several implementations, such feature may be combined with one or more other features of the other implementations as may be desired and advantageous for any given or particular function. Furthermore, to the extent that the terms "including," "includes," "having," "has," "with," or variants thereof are used in either the detailed description and the claims, such terms are intended to be inclusive in a manner similar to the term "comprising." The term "at least one of" is used to mean one or more of the listed items can be selected. As used herein, the term "one or more of" with respect to a listing of items such as, for example, A and B or A and/or B, means A alone, B alone, or A and B. The term "at least one of" is used to mean one or more of the listed items can be selected. Further, in the discussion and claims herein, the term "on" used with respect to two materials, one "on" the other, means at least some contact between the materials, while "over" means the materials are in proximity, but possibly with one or more additional intervening materials such that contact is possible but not required. Neither "on" nor "over" implies any directionality as used herein. The term "conformal" describes a coating material in which angles of the underlying material are preserved by the conformal material.

The terms "about" or "substantially" indicate that the value or parameter specified may be somewhat altered, as long as the alteration does not result in nonconformance of the process or structure to the illustrated embodiment. Finally, "exemplary" indicates the description is used as an example, rather than implying that it is an ideal. Other embodiments of the present teachings will be apparent to those skilled in the art from consideration of the specification and practice of the methods and structures disclosed herein. It is intended that the specification and examples be considered as exemplary only, with a true scope and spirit of the present teachings being indicated by the following claims.

What is claimed is:

1. An apparatus, comprising:
   first and second power transistors;
   driver circuitry for generating gate control signals for the first and second power transistors;
   slew resistors coupled to gates of the first and second power transistors for adjusting slew rates of rising and falling edges of the gate control signals for the first and second power transistors, respectively; and
   dead time control circuitry that is configured to turn on one of the first and second power transistors only when the other of the first and second power transistors is turned off.

2. The apparatus of claim 1, wherein the dead time control circuitry is configured to directly sense gate voltages of the first and second power transistors.

3. The apparatus of claim 1, wherein at least one of the first and second power transistors is a MOSFET.

4. The apparatus of claim 1, further comprising programmable dead time circuitry coupled to the driver.

5. The apparatus of claim 4, wherein the programmable dead time circuitry is configured to be coupled to a resistor whose value establishes a programmed dead time.

6. The apparatus of claim 1, further comprising a PWM controller coupled to the driver circuitry, wherein the driver circuitry is configured to generate the gate control signals in response to a PWM signal from the PWM controller.

7. The apparatus of claim 1, wherein the first and second power transistors are connected together at a node, the apparatus further comprising a bootstrap capacitor connected between the node and a supply voltage.

8. The apparatus of claim 1, wherein the driver circuitry is configured to generate first and second enable signals for the first and second power transistors, respectively, the apparatus further comprising first and second level shifters for adjusting voltage levels of the first and second enable signals, respectively, the adjusted first and second enable signals being used to produce the gate control signals.

9. A method, comprising:
   sensing the beginning of a first power transistor being turned off;
   directly sensing a gate voltage of the first power transistor; and
   turning on a second power transistor when the directly sensed gate voltage of the first power transistor is less than a reference voltage and in response to the sensed beginning of the first power transistor being turned off.

10. The method of claim 9, wherein turning on the second power transistor when the gate voltage of the first transistor is less than the reference voltage further comprises turning on the second power transistor when a gate to source voltage of the first power transistor is less than a threshold voltage of the first power transistor.

11. The method of claim 9, wherein sensing the beginning of the first power transistor being turned off includes allowing a programmable time period to elapse.

12. An apparatus, comprising:
   a first driver circuit having first and second outputs and a second driver circuit having third and fourth outputs;

a first slew resistor coupled between the first output and a first gate control node;

a second slew resistor coupled between the second output and the first gate control node;

a third slew resistor coupled between the third output and a second gate control node;

a fourth slew resistor coupled between the fourth output and the second gate control node;

a first power transistor coupled to the first gate control node;

a second power transistor coupled to the second gate control node; and dead time control circuitry coupled to the first gate control node and the second gate control node.

13. The apparatus of claim 12, further comprising a PWM controller coupled to the first driver circuit and the second driver circuit.

14. The apparatus of claim 12, wherein the dead time control circuitry is configured to turn on one of the first and second power transistors only when the other of the first and second power transistors is turned off.

15. The apparatus of claim 12, wherein the dead time control circuitry is configured to directly sense gate voltages of the first and second power transistors.

16. The apparatus of claim 12, wherein a resistance of the first slew resistor and an input capacitance of the first power transistor establish a slew rate of a rising edge of a signal at the first gate control node.

17. The apparatus of claim 12, wherein a resistance of the second slew resistor and an input capacitance of the first power transistor establish a slew rate of a falling edge of a signal at the first gate control node.

18. The apparatus of claim 12, wherein a resistance of the third slew resistor and an input capacitance of the second power transistor establish a slew rate of a rising edge of a signal at the second gate control node.

19. The apparatus of claim 12, wherein a resistance of the fourth slew resistor and an input capacitance of the second power transistor establish a slew rate of a falling edge of a signal at the second gate control node.

* * * * *